(12) United States Patent
Romero

(10) Patent No.: US 7,990,209 B2
(45) Date of Patent: Aug. 2, 2011

(54) SWITCHED CAPACITOR NOTCH FILTER

(75) Inventor: Hernan D. Romero, Buenos Aires (AR)

(73) Assignee: Allegro Microsystems, Inc., Worcester, MA (US)

( * ) Notice: Subject to any disclaimer, the term of this patent is extended or adjusted under 35 U.S.C. 154(b) by 72 days.

(21) Appl. No.: 12/487,965

(22) Filed: Jun. 19, 2009

(65) Prior Publication Data

US 2010/0321105 A1    Dec. 23, 2010

(51) Int. Cl.
*H03K 5/00* (2006.01)
(52) U.S. Cl. ........................ 327/556; 327/554
(58) Field of Classification Search .......... 327/551–559, 327/336–337, 94, 344
See application file for complete search history.

(56) References Cited

U.S. PATENT DOCUMENTS

| | | | |
|---|---|---|---|
| 4,593,250 A * | 6/1986 | Lucas et al. .................... | 330/107 |
| 5,327,092 A | 7/1994 | Inogai et al. | |
| 5,331,218 A | 7/1994 | Moody et al. | |
| 5,621,319 A | 4/1997 | Bilotti et al. | |
| 6,107,871 A * | 8/2000 | Shin .............................. | 327/554 |
| 6,320,459 B2 | 11/2001 | McCullough | |
| 6,559,689 B1 | 5/2003 | Clark | |
| 6,995,606 B2 | 2/2006 | Billotti et al. | |
| 7,292,095 B2 | 11/2007 | Burt et al. | |
| 7,425,821 B2 | 9/2008 | Monreal et al. | |
| 7,495,508 B2 | 2/2009 | Tan | |
| 7,605,647 B1 | 10/2009 | Romero et al. | |
| 2007/0247141 A1 | 10/2007 | Pastre et al. | |

FOREIGN PATENT DOCUMENTS

JP    59 122216 A    7/1984

OTHER PUBLICATIONS

U.S. Appl. No. 12/722,753, Hernan D. Romero, filed Mar. 12, 2010, 47 pages.
R. Jacob Baker, "CMOS, Circuit Design, Layout, and Simulation", Second Edition, IEEE Press Series on Microelectronic Systems, A John Wiley & Sons, Inc. Publication, 2005, 7 pages.
U.S. Appl. No. 12/111,554, Hernan D. Romero, et al., filed Apr. 29, 2008, 36 pages.
Notification of and International Search Report and Written Opinion of the International Searching Authority for PCT/US2010/034173, dated Aug. 25, 2010, 19 pages.
Brandao, et al. "Switched Capacitor Hadamard Filter Bank in 0.35 μm CMOS". 48th Midwest Symposium on Circuits and Systems, Aug. 7, 2005, pp. 1641-1644, XP010893899.
Saad, "Switched Capacitor Circuits and their Applications an Overview", Radio Science Nineteenth National Conference, Mar. 19, 2002, pp. 51-59, XP010596126.
Haig, et al., "Some Developments towards analogue CMOS VLSI design", 19890101, Jan. 1, 1989, pp. 3/1-3/13, XP006525671.

* cited by examiner

*Primary Examiner* — Dinh T. Le
(74) *Attorney, Agent, or Firm* — Daly, Crowley, Mofford & Durkee, LLP

(57) ABSTRACT

A switched capacitor notch filter for sampling an input signal using multiple sampling capacitors and multiple non-overlapping time periods. The charge from the sampling capacitors is averaged and transferred to the filter output during another non-overlapping time period.

30 Claims, 9 Drawing Sheets

SWITCHED CAPACITOR NOTCH FILTER

CROSS REFERENCE TO RELATED APPLICATIONS

Not Applicable.

STATEMENT REGARDING FEDERALLY SPONSORED RESEARCH

Not Applicable.

FIELD OF THE INVENTION

This invention relates generally to electronic filters and, more particularly, to electronic notch filters which include sampling and averaging functions.

BACKGROUND OF THE INVENTION

Notch filters are often used to remove unwanted signal components within a specific frequency range for a particular circuit. One application for a notch filter is in chopper stabilized Hall effect sensors, in which a notch filter, sometimes referred to as a sinc filter, may be used to remove unwanted components, such as a modulated offset signal component which arises as ripple, that result from the chopping operation without requiring a multi-pole filter approach that may result in unacceptable time delays to the sensor output signal. Offset in a sensor is undesirable as it may limit the minimum detectable signal of the sensor. One such arrangement is described in a U.S. Pat. No. 7,425,821 entitled "Chopped Hall Effect Sensor" which issued on Sep. 16, 2008 to Allegro Microsystems, Inc. of Worcester, Mass., the Assignee of the subject invention.

Some notch filters sample and average an input signal. A typical implementation may use two sampling stages to avoid excessive residual harmonic components. The first stage performs a sample and hold function at some time. A second stage samples the output of the first stage at a ninety degree phase shift with respect to the first stage, so as to avoid the dv/dt generated from the non-ideal sampling pulses in the first stage. The output of the second sampling stage is fed into the averaging stage, which may employ resistive averaging, multi-gate/base averaging, or charge redistribution averaging techniques. The first two approaches are continuous time approaches and charge redistribution is a discrete time approach. The continuous time approaches generally require two sampling stages, relatively large sampling capacitor sizes, such as on the order of 4-10 picofarads, and an output buffer for isolating the sampling stages from the averaging stage which may consume a significant area. This buffer stage—as well as the averaging stage—may introduce offset to the circuit. In addition the buffer stage may not be suited for dynamically cancelling its offset contribution to the circuit. The charge distribution discrete time approach uses the second sampling stage as the charge redistribution averaging stage and also requires relatively large sampling capacitor sizes, such as on the order of 4-10 picofarads, and an output buffer for isolating the capacitors holding the averaged signal from the remainder of the circuit, which output buffer may also be area consuming and not suited for using dynamic offset cancellation techniques for removing its offset contribution to the circuit.

Other notch filters sample and integrate (rather than averaging) an input signal, such as a chopped signal synchronized with the chopper clock in such a way the unwanted ripple resulting from the chopper operation is integrated to zero over each chopper clock period. However, the accuracy of this approach highly depends on the integrating clocks phases relative to the chopper clock, and is also susceptible to the sampling non-ideal effects like charge injection and clock feed-through, such effects being reduced if averaging is used instead.

A post-filter stage may be required when using a notch filter in order to further attenuate high frequency residual components not removed (or generated) by the notch filter. As one example, the post-filter stage may be implemented with a low pass filter topology, which may consist of a resistor in parallel with a fixed capacitor in an operational amplifier feedback network. This resistor may be implemented with a switched capacitor topology to reduce the size of the circuit.

SUMMARY OF THE INVENTION

A switched capacitor notch filter according to the invention includes a first sampling capacitor, a second sampling capacitor, an operational amplifier, and a first feedback capacitor. Each sampling capacitor is coupled to a respective set of switches that are controlled such that the first and second sampling capacitors are alternately charged during a first time period and a second, non-overlapping time period, respectively. The switches are further controlled such that during a third, non-overlapping time period, the sampling capacitors are coupled in parallel and to an input node of the operational amplifier.

In general, the filter includes a sampling and averaging portion comprising at least two switched capacitor sampling networks, with each such network comprising a respective sampling capacitor and associated switches, an operational amplifier, and a first feedback capacitor. In some embodiments, the sampling and averaging portion may include two switched capacitor sampling networks, while in other embodiments the sampling and averaging portion may include more than two switched capacitor sampling networks.

With this arrangement, the charge from the sampling capacitors is simultaneously averaged and transferred to the amplifier output during an averaging time period, thereby eliminating the need for conventional buffering between sampling and averaging stages of a notch filter and the associated drawbacks.

In some embodiments, a switched capacitor feedback network is coupled in parallel with the first feedback capacitor provided in the feedback arrangement with respect to the operational amplifier. The switched capacitor feedback network includes a second feedback capacitor and a respective set of switches. Such embodiments additionally provide low-pass filter functionality and component selection allows adjustment of the low pass filter cutoff frequency and DC gain.

Reference switches are provided to selectively couple terminals of each sampling capacitor to reference nodes. In some embodiments, a common reference voltage is provided at the reference nodes and in other embodiments, different reference voltages are provided at different reference nodes.

According to a further aspect of the invention, integrator functionality may be provided in embodiments in which the switched capacitor feedback network is eliminated, in which case the reference nodes may be coupled to the same or different reference voltages.

According to another aspect of the invention, low pass filter functionality may be provided in embodiments in which a reference node is coupled the output of the operational amplifier. The described notch filter may be used in a chopper stabilized Hall Effect sensor to reduce or eliminate unwanted signal components, such as a modulated offset signal which arises as ripple.

In differential implementations of the switched capacitor notch filter, a first sampling and averaging portion including at least two switched capacitor sampling networks is associated with a first differential input signal and a second sampling and averaging portion including at least two switched capacitor sampling networks is associated with a second differential input signal. These sampling and averaging portions are coupled to respective inputs of a differential amplifier having a first feedback capacitor and an optional switched capacitor feedback network in a negative feedback arrangement with respect to the operational amplifier and further having a first differential feedback capacitor and an optional differential switched capacitor feedback network in a negative feedback relationship with respect to the operational amplifier.

BRIEF DESCRIPTION OF THE DRAWINGS

The foregoing features of the invention, as well as the invention itself may be more fully understood from the following detailed description of the drawings, in which.

DETAILED DESCRIPTION OF THE INVENTION

Figure 1:
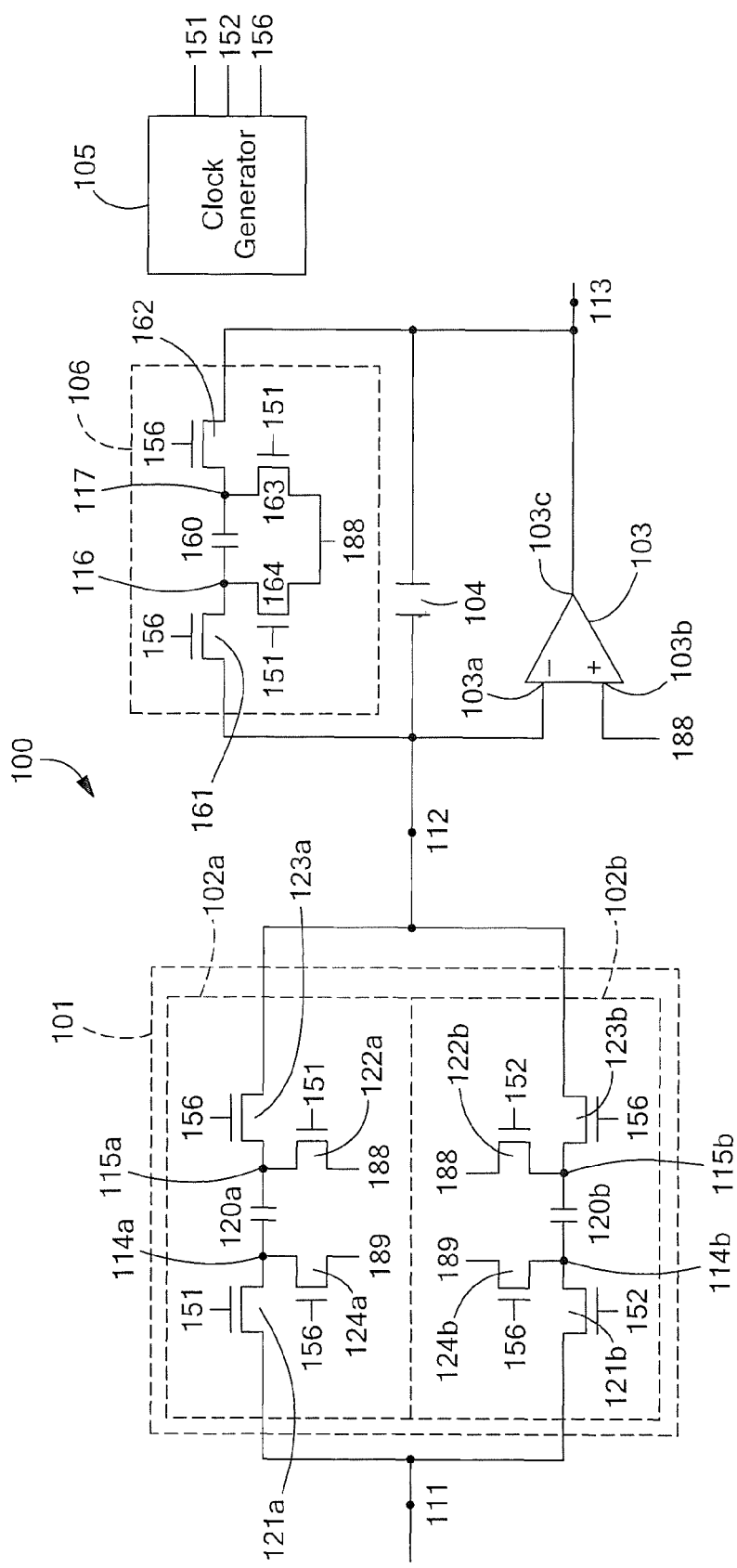
FIG. 1 is a schematic of a switched capacitor notch filter according to the invention.
Figure 1A:
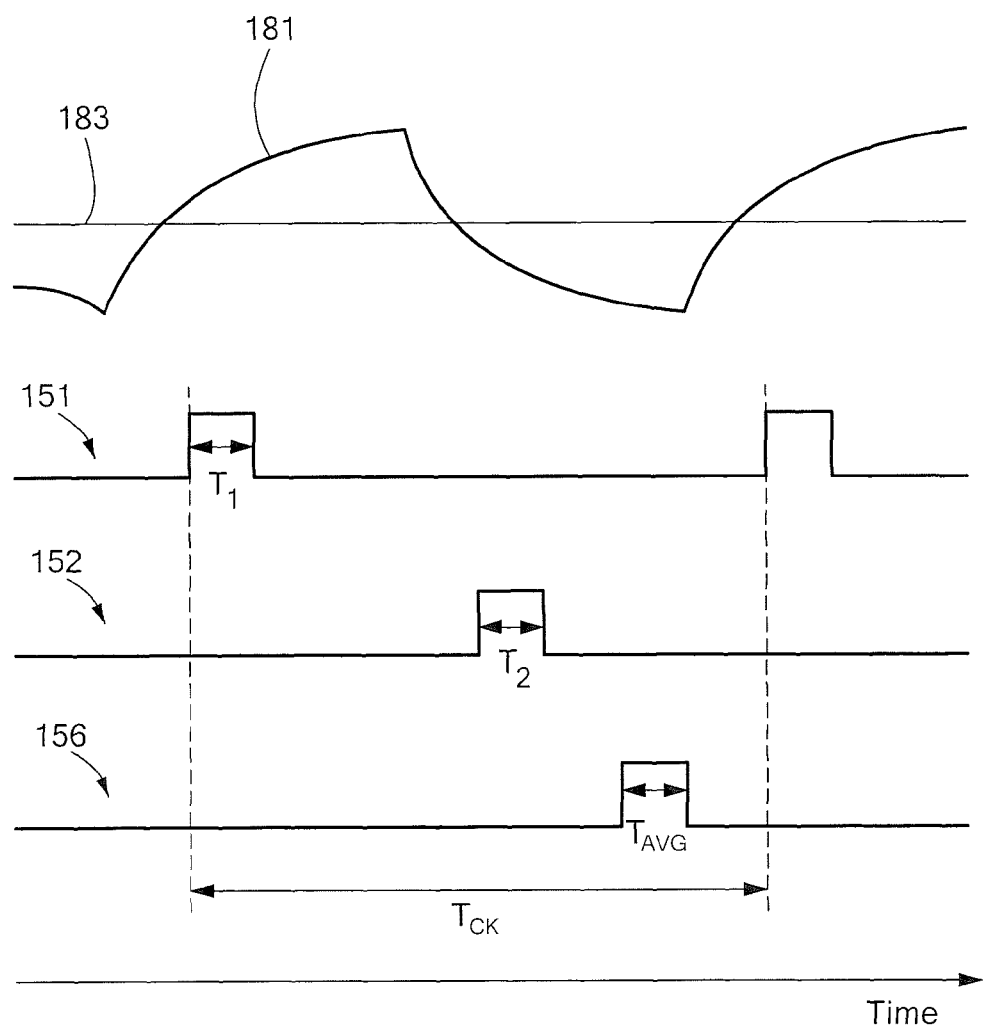
FIG. 1A shows illustrative clock signals for the filter of FIG. 1.

Referring to FIG. 1, a single-ended switched capacitor notch filter 100 includes an input terminal 111 adapted for receiving an input signal 181 (FIG. 1A). A sampling and averaging portion 101 of circuit 100 includes at least two switched capacitor sampling networks 102a, 102b. In the illustrative embodiment of FIG. 1, two switched capacitor sampling networks 102a, 102b are shown; however, as will become apparent from consideration of FIGS. 1B and 1D below, more than two such networks may be used.

Each switched capacitor sampling network 102a, 102b comprises a respective sampling capacitor and associated switches. More particularly, the first switched capacitor sampling network 102a includes a first sampling capacitor 120a and associated switches 121a, 122a, 123a, and 124a and the second switched capacitor sampling network 102b includes a second sampling capacitor 120b and associated switches 121b, 122b, 123b, and 124b. The first sampling capacitor 120a has a first terminal 114a coupled to a first switch 121a to selectively couple the first sampling capacitor to the input terminal 111 and a second terminal 115a coupled to a second switch 123a to selectively couple the first sampling capacitor to a common node 112. The second terminal 115a of the first sampling capacitor 120a is also selectively coupled to a first reference node 188 by a first reference switch 122a. The first terminal 114a of the first sampling capacitor 120a is selectively coupled to a second reference node 189 by a second reference switch 124a.

The second sampling capacitor 120b has a first terminal 114b coupled to a third switch 121b to selectively couple the second sampling capacitor to the input terminal 111 and a second terminal 115b coupled to a fourth switch 123b to selectively couple the second sampling capacitor 120b to the common node 112. The second terminal 115b of the second sampling capacitor 120b is also selectively coupled to the first reference node 188 by a third reference switch 122b. The first terminal 114b of the second sampling capacitor 120b is selectively coupled to the second reference node 189 by a fourth reference switch 124b.

In one embodiment, the reference nodes 188, 189 are coupled together and to ground or other reference potential. In other embodiments, the reference nodes 188, 189 may be coupled to different reference potentials or other circuit nodes, as will be described further below.

The notch filter 100 includes an operational amplifier 103 having a negative input terminal 103a coupled to the common node 112 and a positive input terminal 103b coupled to the first reference node 188. An output terminal 103c of the operational amplifier 103 provides the output terminal 113 of the filter. A first feedback capacitor 104, here a fixed feedback capacitor, is coupled between the output terminal 113 and the common node 112.

The filter 100 further includes a clock generator 105 adapted to provide clock signals for controlling the various switches. In particular, a first clock signal 151 is provided to close the first switch 121a and the first reference switch 122a during a first portion of each clock cycle and a second, non-overlapping clock signal 152 to close the third switch 121b and the third reference switch 122b during a second portion of each clock cycle. The clock signal generator 105 further provides an averaging, non-overlapping clock signal 156 to close the second switch 123a, fourth switch 123b, second reference switch 124a, and fourth reference switch 124b during an averaging portion of each clock cycle In operation, the sampling capacitors 120a, 120b are alternately charged during first and second non-overlapping time periods, respectively. During an averaging, non-overlapping time period, the charge on (i.e., the voltage across) the sampling capacitors is simultaneously averaged and transferred to the filter output 113.

Referring also to FIG. 1A, illustrative switch control signals are shown along with an illustrative filter input signal 181 for coupling to input terminal 111 and an illustrative filter output signal 183 provided at filter output terminal 113. During a first portion $T_1$ of each clock cycle $T_{ck}$ (herein the first time period), the first clock signal 151 is in a logic state, here high, to close controlled switches 121a, 122a and all other switches are open. Thus, during time period $T_1$, the first sampling capacitor 120a is coupled to the input terminal 111 and the first reference node 188. During a second non-overlapping portion $T_2$ of each clock cycle $T_{ck}$ (herein the second time period) the second clock signal 152 is in a logic state, here high, to close controlled switches 121b, 122b and all other switches are open. Thus, during time period $T_2$, the second sampling capacitor 120b is coupled to the input terminal 111 and the first reference node 188. Thus, during the first time period $T_1$, sampling capacitor 120a is charged by the input signal 181 and during the second time period $T_2$, sampling capacitor 120b is charged by the input signal 181. During an averaging non-overlapping portion $T_{AVG}$ of each clock cycle $T_{ck}$ (herein the averaging time period), the averaging control, or clock signal 156 is in a logic state, here high, to close the controlled switches 123a, 123b, 124a, and 124b and all other switches are open. It is during the averaging time period $T_{AVG}$ that the charge on the sampling capacitors is averaged as the charge is simultaneously transferred from the sampling capacitors to the filter output 113. In other words, during the averaging time period, sampling capacitors 120a, 120b are coupled in parallel from the common node 112 to ground (in applications in which reference node 189 is coupled to ground) and the feedback network of the operational amplifier 103 includes fixed capacitor 104 coupled between the amplifier input node 103a and output node 103c.

The above-described notch filter 100 may, in addition to providing filtering of signals having a predetermined frequency (i.e., the notch functionality), provide an integrator characteristic or a low-pass filter characteristic. In particular, if the reference nodes 188 and 189 are coupled to reference voltages, either the same reference voltage or different reference voltages, then an integrator characteristic will result. Alternatively, if the reference node 189 is coupled to the output node 113 of the operational amplifier 103 and the reference node 188 is coupled to a reference voltage, then a low-pass filter characteristic will result.

Typical capacitor values for capacitors 120a, 120b, and 104 are on the order of 0.1 to 1 pF. The sampling capacitor values used in the present invention may be made smaller, which results in an area saving, than those of a typical two stage sampling and averaging circuit because the capacitors in the present invention are floating as in the stray insensitive arrangement used for switched capacitors.

The operating frequency, or notch frequency, $f_{ck}$, of the notch filter 100 is determined by the effective sampling frequency divided by the number of sampling capacitors. The effective sampling frequency refers to the rate at which the filter input signal is sampled. Thus, the illustrative clock signals 151, 152 of FIG. 1A establish an effective sampling frequency of $2/T_{ck}$. As will be apparent, the effective sampling clock frequency would be higher for an embodiment with more samples taken during each clock cycle. The clock frequency is selected to reduce the unwanted frequency components to an acceptable level based on the use of the filter in a given application. Typical operating frequencies, or notch filter frequencies, or in some applications the modulation frequency, may be in the range of 2 kHz to 2 MHz, although these frequencies may be larger or smaller depending on the exact application of the filter circuit. In one illustrative embodiment, the operating frequency of the filter 100 may be on the order of 100 kHz to 400 kHz. In this particular embodiment with two samples per clock cycle the effective sampling frequency would be on the order of 200 kHz to 800 kHz. In applications in which the notch filter 100 filters frequency components at a modulation frequency, the minimum notch frequency may be limited by the modulation frequency. The maximum notch frequency is typically limited by the gain-bandwidth product of the operational amplifier, which is dependent on the fabrication technology used to build the circuit.

The settling time associated with the switches and capacitors used for sampling and averaging determine the required duration of the different pulse widths (i.e., time period $T_1$ of clock signal 1512, time period $T_2$ of clock cycle 152, and time period $T_{AVG}$ of clock signal 156). In order to minimize the harmonic distortion and gain loss, the time constant of the resistance of the switches and the sampling capacitor should be sized such that the signal settles to 99.9%, or whatever percentage is required for the allowable error limit of a particular filter, within the clock pulse width. The width of the clock pulses may be adjusted once the sampling capacitors and switches have been sized in a given filter design.

In another embodiment, a switched capacitor feedback network 106 is coupled in parallel with the fixed capacitor 104. The switched capacitor feedback network includes a second feedback capacitor, or switched feedback capacitor 160 selectively coupled between the common node 112 and the output node 113 via switches 161 and 162. In particular, a first terminal 116 of the second feedback capacitor 160 is selectively coupled to the common node 112 by a fifth switch 161; a sixth switch 162 selectively couples a second terminal 117 of the second feedback capacitor 160 to the output node 113. The second terminal 117 of the second feedback capacitor 160 is also selectively coupled to reference node 188 by a fifth reference switch 163 and first terminal 116 of the second feedback capacitor 160 is selectively coupled to the reference node 188 by a sixth reference switch 164.

The fifth and sixth switches 161 and 162 are controlled by the averaging clock signal 156 such that during the averaging time period $T_{AVG}$, switches 161, 162 couple the second feedback capacitor 160 between the common node 112 and the output node 113. During a non-overlapping portion of the clock cycle (with respect to the averaging time period), the second feedback capacitor 160 is coupled to reference node 188, this may be referred to as a reset time for the switched feedback capacitor. This is achieved by closing the fifth and sixth reference switches 163, 164 during either or both of the first and second time periods $T_1$ and $T_2$.

In yet another embodiment a fourth clock signal, not shown, with a time period $T_{RESET}$ which does not overlap any of the other three time periods $T_1$, $T_2$, $T_{AVG}$ could be employed to reset the switched feedback capacitor 160 with the fifth and sixth reference switches. Such an implementation may result in increased delay to the circuit and lower overall bandwidth, or increased response time of the circuit.

With this arrangement, during the averaging time period $T_{AVG}$, the feedback network of the amplifier 103 includes the parallel combination of capacitors 104 and 160. The use of the second feedback capacitor 160 has the advantage of allowing a gain of the circuit 100 to be modified from the unity gain case that would exist if only the first feedback capacitor 104 were present, since the switched capacitor acts as a resistor. The gain of the notch filter 100 may be calculated by using the following equation for the case of n sampling capacitors:

$$DC\ Gain = (C_1 + C_2 + \ldots + C_n)/C_{sf} \quad \text{equation (1)}$$

where $C_1$ would be sampling capacitor 120a, $C_2$ is sampling capacitor 120b, $C_n$ is the $n^{th}$ sampling capacitor (as will be described in connection with FIGS. 1B and 1D), and $C_{sf}$ is the value of the second feedback capacitor 160. For the case where there is no switched feedback capacitor 160 the value of $C_{sf}$ may be replaced by $C_1 + C_2 + \ldots C_n$, which shows the unity gain of the filter.

The cutoff frequency (−3 dB point) of the notch filter 100 may be defined by the following equation:

$$\text{Notch Cutoff frequency} = \frac{(f_{avg} C_{sf})}{(2\pi C)} \quad \text{equation (2)}$$

where $f_{avg}$ is the averaging frequency of the circuit (i.e., the frequency at which the sampled charge is averaged), $C_{sf}$ is the value of the second feedback capacitor 160 and C is the value of the first or fixed feedback capacitor 104. In the embodiment of FIGS. 1 and 1A, where there is one averaging time period $T_{AVG}$ per clock cycle, the averaging frequency, $f_{avg}$, is equivalent to the operating or notch frequency, $f_{ck}$ (i.e., $f_{ck}=1/T_{ck}$).

In the embodiment of FIGS. 1 and 1A the averaging frequency $f_{avg}$ is the effective sampling frequency divided by the number of sampling capacitors. For the illustrative case of n=2 sampling capacitors and an effective sampling frequency of 200 kHz, the operating or notch frequency, $f_{ck}$ (i.e., $f_{ck}=1/T_{ck}$), may be calculated as 200 kHz/2 which is 100 kHz. Other frequency values larger and smaller than 200 kHz may also be used depending on the application of the circuit 100. For the case where only the fixed capacitor 104 is coupled between nodes 112 and 113, the value of $C_{sf}$ in equation 2 is simply the sum of the n sampling capacitors, which for circuit 100 in FIG. 1 would be the summation of the capacitance values of the capacitors 120a and 120b.

For both cases, the case with only the fixed capacitor 104 coupled between nodes 112 and 113 and the reference 189 coupled to the output 113 as well as the case with the second feedback capacitor 160 coupled between nodes 112 and 113 and references node 189 coupled to a reference potential rather than to the output 113, a low pass filter (LPF) characteristic is provided which may be helpful in some applications, and may eliminate the need for a smoothing filter if low noise is not required. If a low noise output is required, then an additional smoothing filter may still be required after the output of the filter 100 at node 113.

Figure 1B:
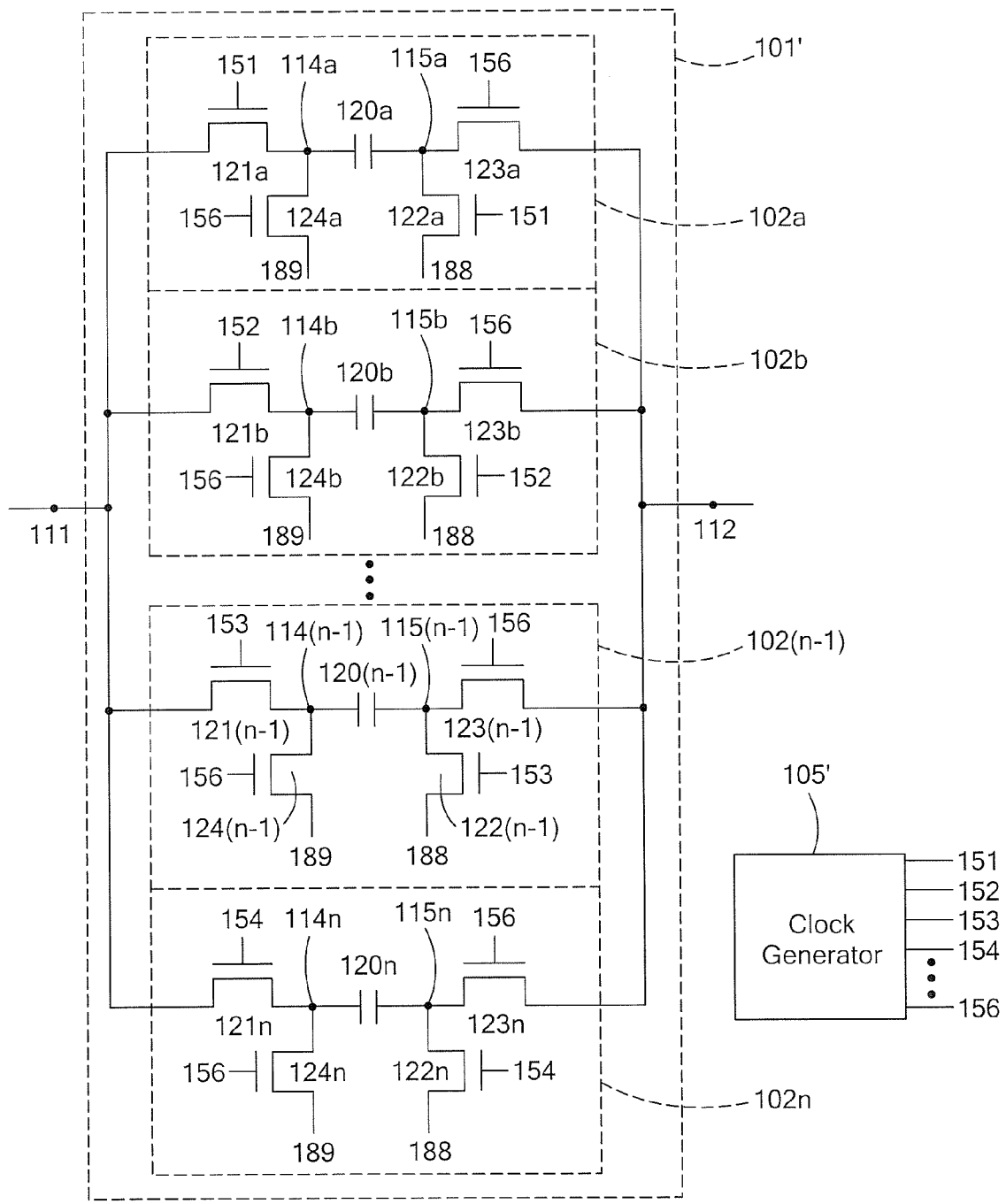
FIG. 1B shows a plurality of switched capacitor sampling networks suitable for use in the notch filter of FIG. 1.
Figure 1C:
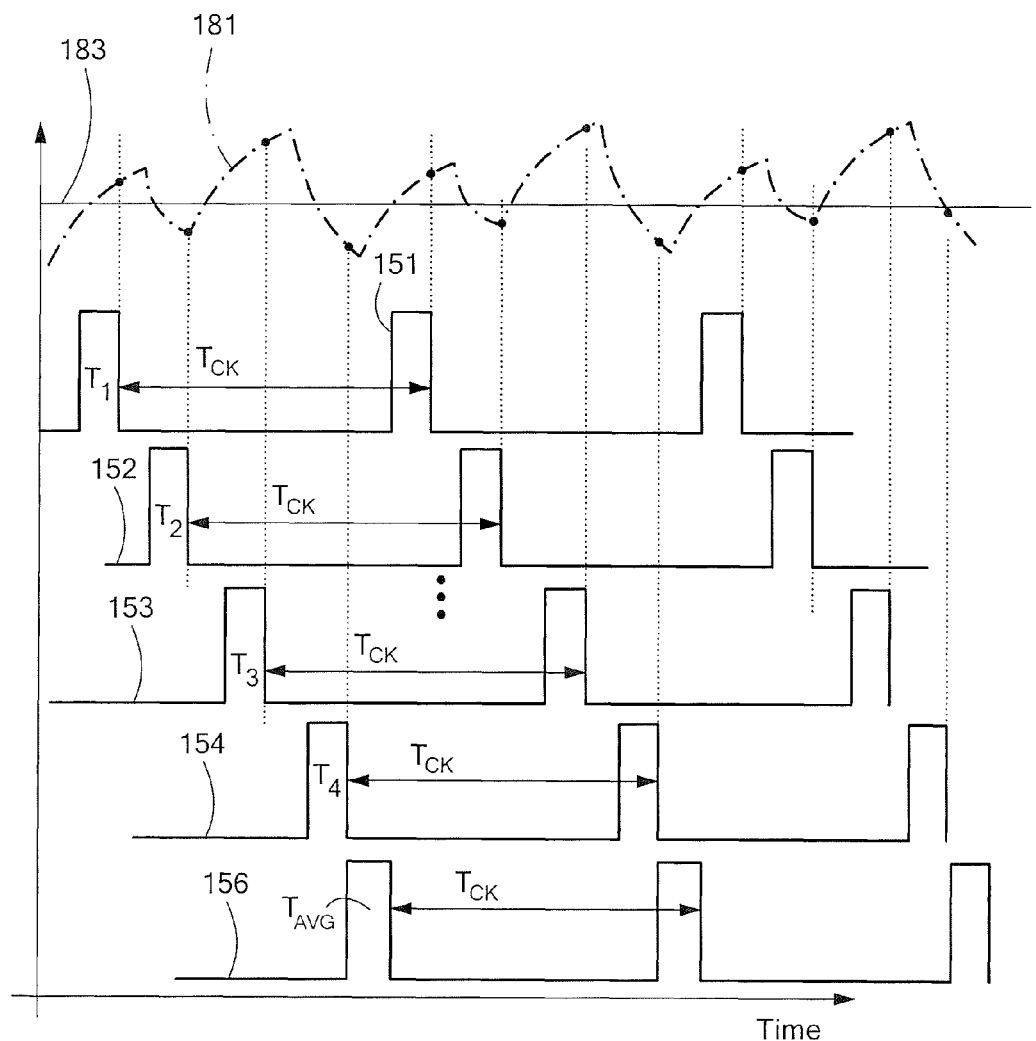
FIG. 1C shows illustrative clock signals for the filter of FIGS. 1 and 1B.

As noted above and according to a further aspect of the invention, the sampling and averaging portion 101 of the notch filter 100 may include more than two switched capacitor sampling networks. Referring to FIGS. 1B and 1C in which like reference numbers refer to like elements, most generally, an alternative sampling and averaging portion 101' for use in the filter 100 of FIG. 1 (in place of sampling and averaging portion 101) includes n switched capacitor sampling networks 102a-102n, each containing a sampling capacitor 120a-n and their associated switches 121a-n, 122a-n, 123a-n and 124a-n. An alternative clock generator 105' for use with sampling and averaging portion 101 in the filter 100 of FIG. 1 (in place of clock generator 105) provides the required clock signals to the filter 100. For the general case of n switched capacitor sampling networks, it will be apparent that n+1 clock signals are needed to operate a notch filter having sampling and averaging portions 102a-102n, with n of the clock signals devoted to sampling each of the n sampling capacitors during non-overlapping time periods and one, non-overlapping clock signal (n+1) devoted to the averaging and charge transfer operation.

In one particular embodiment, n=4. In operation, during a first time portion $T_1$ of the clock cycle $T_{ck}$ the first clock signal 151 is in a logic state, here high, to close controlled switches 121a, 122a. Thus, during time period $T_1$, the first sampling capacitor 120a is coupled to the input terminal 111 and the first reference node 188. During a second non-overlapping portion $T_2$ of each clock cycle $T_{ck}$ the second clock signal 152 is in a logic state, here high, to close controlled switches 121b, 122b. Thus, during time period $T_2$, the second sampling capacitor 120b is coupled to the input terminal 111 and the first reference node 188. During a third non-overlapping portion $T_3$ of each clock cycle $T_{ck}$ the third clock signal 153 is in a logic state, here high, to close controlled switches 121(n-1), 122(n-1). Thus, during time period $T_3$, the third sampling capacitor 120(n-1) is coupled to the input terminal 111 and the first reference node 188. During a fourth non-overlapping portion $T_4$ of each clock cycle $T_{ck}$ the fourth clock signal 154 is in a logic state, here high, to close controlled switches 121n, 122n. Thus, during time period $T_4$, the fourth sampling capacitor 120n is coupled to the input terminal 111 and the first reference node 188. During an averaging non-overlapping portion $T_{AVG}$ of each clock cycle $T_{ck}$; (herein the averaging time period), the averaging control signal 156 is in a logic state, here high, to close the controlled switches 123a-n, 124a-n. It is during the averaging time period $T_{AVG}$ that the charge on the sampling capacitors 120a-n is averaged as the charge is simultaneously transferred from the sampling capacitors to the filter output 113, as shown in FIG. 1.

As is apparent from the above discussion, the switches are controlled so as to accumulate the sample charge and then average and transfer the charge to the filter output. This switch control scheme may be referred to as "accumulate and dump."

Figure 1D:
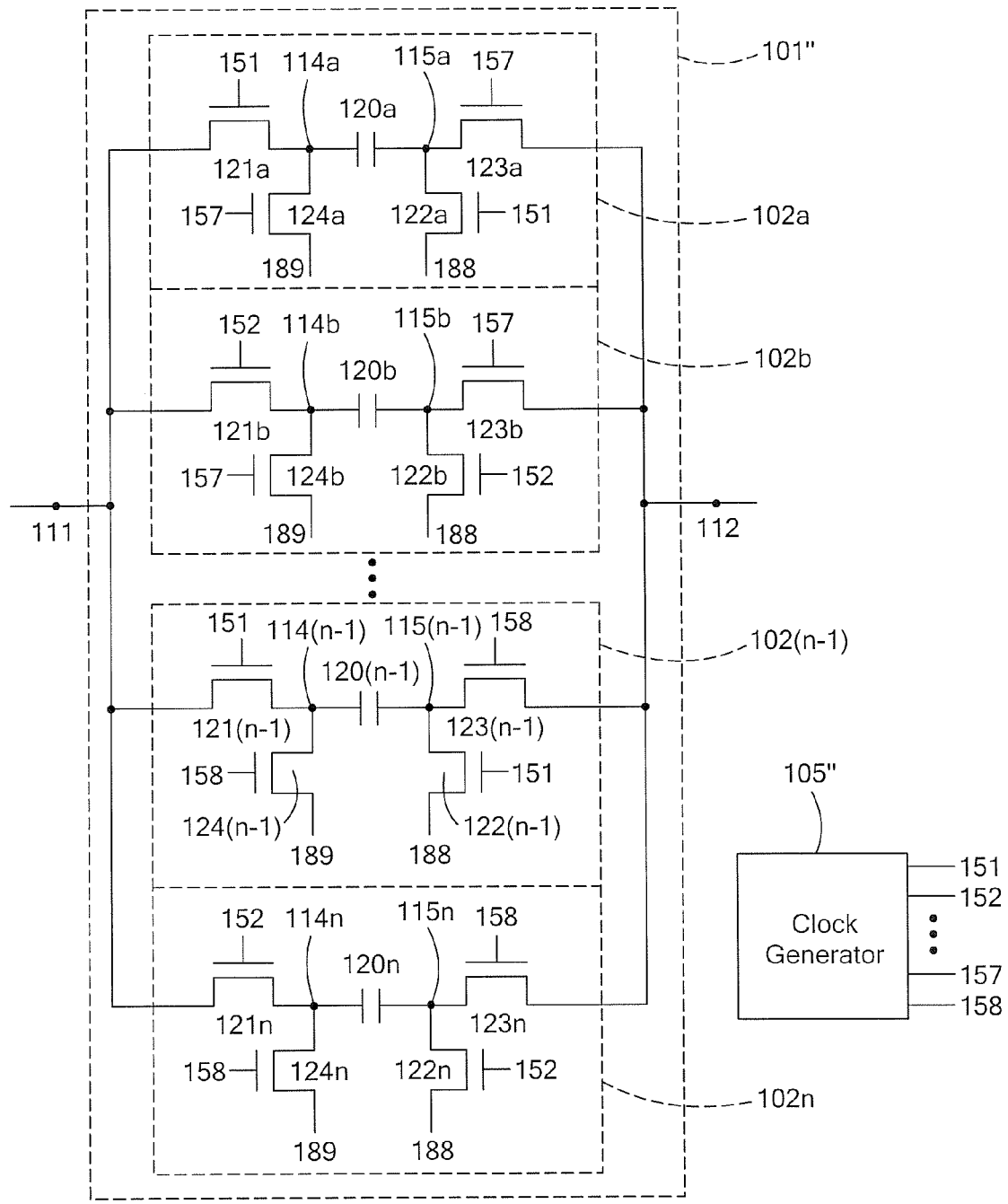
FIG. 1D shows an alternative plurality of switched capacitor sampling networks suitable for use with the notch filter of FIG. 1.
Figure 1E:
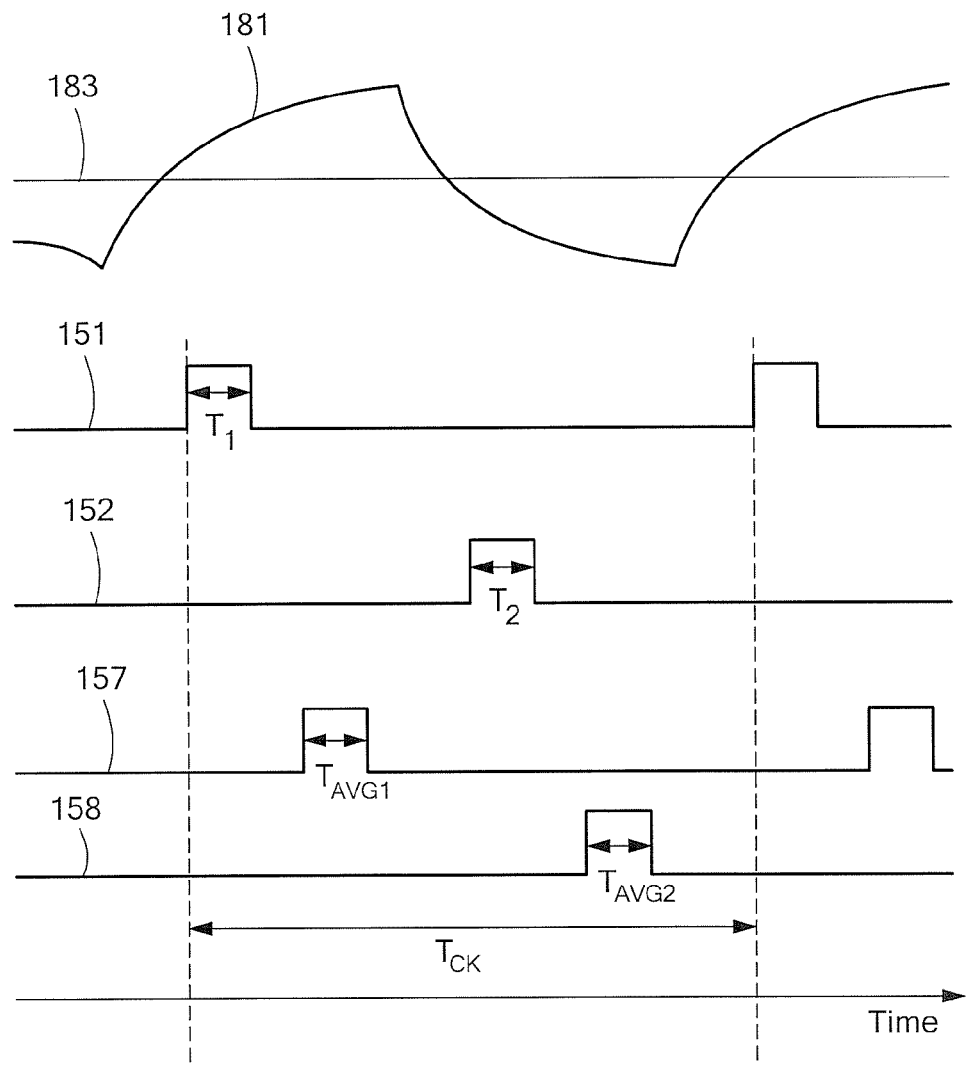
FIG. 1E shows illustrative clock signals for the circuit of FIGS. 1 and 1D.

A running average embodiment alternatively may be achieved through the use of at least two averaging time periods per clock cycle. Referring to FIGS. 1D and 1E, an alternative sampling and averaging portion 101'' suitable for use in the filter 100 of FIG. 1 in place of sampling and averaging portion 101 is capable of taking a running average of input samples. The running average embodiment of FIG. 1D differs from the "accumulate and dump" embodiment of FIG. 1B in the clock signals coupled to switches 121(n-1), 121n, 122(n-1), 122n, 123a-n, and 124a-n. Specifically switches 123a, 123b, 124a, 124b are controlled by a first averaging clock signal 157 establishing a first averaging time period $T_{AVG1}$ and switches 123(n-1), 123n, 124(n-1), 124n are controlled by a second averaging clock signal 158 establishing a second averaging time period $T_{AVG2}$. As will become apparent, in this embodiment, multiple sampling capacitors sample the input signal at the same time (e.g., here capacitors 120a, 120(n-1) sample during time period $T_1$) and there is more than one averaging time portion per clock cycle (here two averaging portions $T_{AVG1}$ and $T_{AVG2}$ established by respective clock signals 157, 158).

Clock generator 105'' is provided to supply the clock signals required for this embodiment. If the switched feedback capacitor network 106 is in the feedback loop of the notch filter 100, which is not always required, then its switches 161 and 162 may be controlled by clock signals 157 and 158. With this arrangement, two averaging operations occur during every clock cycle $T_{ck}$ (i.e., during time periods $T_{AVG1}$ and $T_{AVG2}$) in a non-overlapping fashion as shown in FIG. 1E.

In operation, capacitors 120a and 120n-1 sample the input signal during time period $T_1$ and capacitors 120b and 120n sample the input signal during time period $T_2$. The charge from sampling capacitors 120a and 120b is averaged and transferred to the filter output during the first non-overlapping averaging time period $T_{AVG1}$. During a second non-overlapping averaging time period $T_{AVG2}$, the charge from the sampling capacitors 120(n-1) and 120n is averaged and transferred to the filter output. For the case of four switched sampling capacitor networks (i.e., n=4) and two averaging time periods, $T_{AVG1}$ and $T_{AVG2}$, per clock cycle $T_{ck}$ shown in FIGS. 1D and 1E the averaging frequency, $f_{avg}$ is two times the clock frequency, $f_{ck}$ or $2f_{ck}$, since the sampled charge is averaged twice during each clock cycle. Thus, the operating frequency, $f_{ck}$, may be the same in FIGS. 1A, 1C, and 1E, but the notch cutoff frequency of equation 2 above for FIG. 1E is double the notch cutoff frequency for the embodiment of FIG. 1A or 1C. This is due to the fact that in FIG. 1E the averaging frequency, $f_{avg}$, is doubled when compared to FIGS. 1A and 1C since there are two averaging periods $T_{AVG1}$ and $T_{AVG2}$ per time period $T_{ck}$ in the case of FIG. 1E. The running average results in the input being averaged over a larger portion of $T_{ck}$ which results in more high frequency content from the input 111 to the output of the filter 113, but it does require additional switched capacitor circuits and therefore increased die area which may not always be desired.

Figure 2:
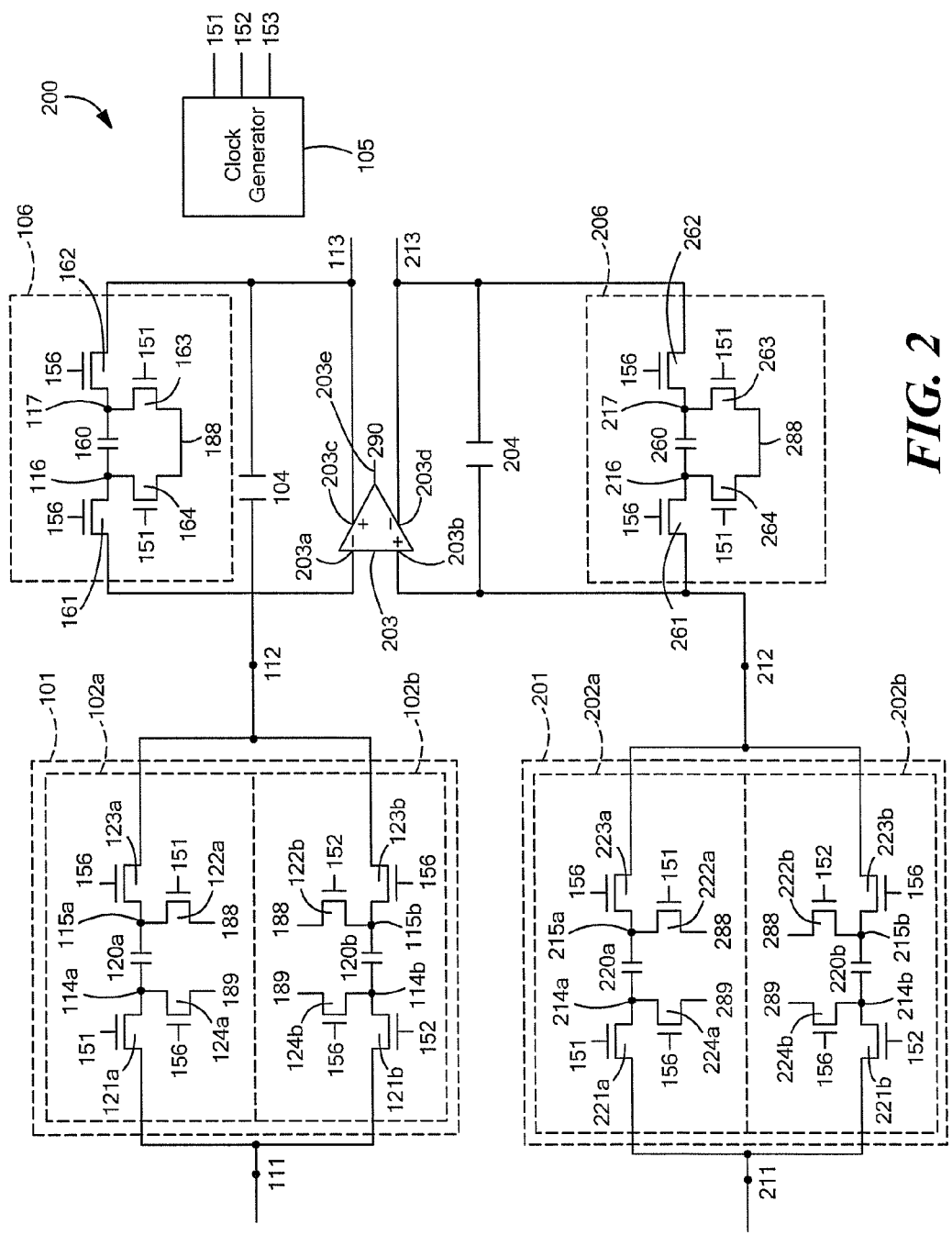
FIG. 2 is a schematic of an alternative switched capacitor notch filter for processing a differential input signal according to the invention.

According to a further aspect of the invention, a differential implementation notch filter 200 is shown in FIG. 2 where like elements have the same reference numbers. Such an implementation may be more suitable for a magnetic sensor circuit than the single-ended implementation described previously. A differential sampling and averaging portion 201 of circuit 200 includes a first switched capacitor sampling network 202a which includes a first differential sampling capacitor 220a and associated switches 221a, 222a, 223a and 224a and a second switched capacitor portion 202b which includes a second differential sampling capacitor 220b and associated switches 221b, 222b, 223b, and 224b. The first differential sampling capacitor 220a has a first terminal 214a coupled to a first differential switch 221a to selectively couple the first differential sampling capacitor to the differential input terminal 211 and a second terminal 215a coupled to a second differential switch 223a to selectively couple the first differential sampling capacitor to a differential common node 212. The second terminal 215a of the first differential sampling capacitor 220a is also selectively coupled to a first differential reference node 288 by a first differential reference switch 222a. In some embodiments the first differential reference node 288 is at the same potential as the first reference node 188 which may be, but is not required to be at the same potential as a reference node 290. The first terminal 214a of the first differential sampling capacitor 220a is selectively coupled to a second differential reference node 289, which in some embodiments is at the same potential as node 189, by a second differential reference switch 224a.

A second differential sampling capacitor 220b has a first terminal 214b coupled to a third differential switch 221b to selectively couple the second differential sampling capacitor to the differential input terminal 211 and a second terminal 215b coupled to a fourth differential switch 223b to selectively couple the second differential sampling capacitor 220b to the differential common node 212. The second terminal 215b of the second differential sampling capacitor 220b is also selectively coupled to the first differential reference node 288, by a third differential reference switch 222b. The first terminal 214b of the second differential sampling capacitor 220b is selectively coupled to the second differential reference node 289 by a fourth differential reference switch 224b. In some embodiments the second differential reference node 289 may be at the same potential as reference node 288 which may be the same potential as reference node 290. Reference nodes 288 and 289 may also be at the same potential as node 188 and 189.

The differential notch filter 200 includes an operational amplifier 203 having a negative input terminal (first input terminal) 203a coupled to the common node 112 and a positive input terminal (second input terminal) 203b coupled to the differential common node 212, a positive output terminal (first output terminal) 203c coupled to a positive output node 113, a negative output terminal (second output terminal) 203d coupled to the negative output node 213, and a reference terminal 203e which is coupled to a reference node 290, which may be a reference voltage or ground in some embodiments.

A first differential feedback capacitor 204, here a fixed feedback capacitor, is coupled between the negative differential output terminal 213 and the differential common node 212.

The filter further includes a clock generator 105 adapted to provide clock signals for controlling the various switches.

The circuit 200 operates by charging both pairs of sampling and differential sampling capacitors during first and second time periods. The operation of single-ended circuit portions 101, 104 and 106 is as described above. The charge from the sampling and differential sampling capacitors is transferred to the feedback and differential feedback capacitors, respectively, during an averaging non-overlapping time period. Illustrative clock signals 151, 152, 156 are shown in FIG. 1A.

During a first portion $T_1$ of each clock cycle, the first clock signal 151 is in a logic state, here high, to close controlled differential switches 221a, 222a. Thus during time period $T_1$, the first differential sampling capacitor 220a is coupled to the differential input terminal 211 and the first differential reference node 288. During a second non-overlapping time portion $T_2$ of each clock cycle the second clock signal 152 is in a logic state, here high, to close controlled differential switches 221b, 222b. The second differential sampling capacitor 220b is coupled to the differential input terminal 211 and the first differential reference node 288. Thus, during the first time portion $T_1$, differential sampling capacitor 220a is charged by the input signal 181 and during the second time period $T_2$, differential sampling capacitor 220b is charged by the input signal 181. During a third non-overlapping time portion $T_{AVG}$ of each clock cycle $T_{ck}$ the averaging control signal 156 is in a high logic state to close the controlled differential switches 223a, 224a, 223b and 224b. It is during the averaging period $T_{AVG}$ that the charge on the sampling and differential sampling capacitors is averaged as it is simultaneously transferred from the sampling capacitors 120a, 120b to the feedback capacitor 104 and from the differential sampling capacitors 220a, 220b to the differential feedback capacitor 204, respectively. In other words, as was the case for the sampling capacitors 120a, 120b described above, differential sampling capacitors 220a, 220b are coupled in parallel from the differential common node 212 to a reference voltage and the feedback network of the differential operational amplifier 203 includes differential fixed capacitor 204 coupled between the differential amplifier input 203b and the differential output 203d. In this embodiment, the filter provides an integrator characteristic when reference node 289 is coupled to reference voltage. In the case where reference node 289 is connected to the differential output node 213 at node 203d of the operational amplifier a low-pass filter embodiment is realized.

In another embodiment, a differential switched feedback capacitor network 206 is coupled in parallel to differential feedback capacitor 204. The differential switched capacitor feedback network 206 has a second differential feedback capacitor 260, or a switched differential feedback capacitor, and its associated switches 261, 262, 263, and 264. The second differential feedback capacitor 206 is selectively coupled between the differential common node 212 and the negative differential output node 213 via switches 261, 262. In particular, a first terminal 216 of the second differential feedback capacitor 260 is selectively coupled to the differential common node 212 by a fifth differential switch 261 and a sixth differential switch 262 selectively couples a second terminal 217 of the second differential feedback capacitor 260 to the negative differential output node 213. The second terminal 217 of the second differential feedback capacitor 260 is also selectively coupled to reference node 288 by a fifth differential reference switch 263 and first terminal 216 of the second differential feedback capacitor 260 is selectively coupled to node 288 by a sixth differential reference switch 264.

The fifth and sixth differential switches 261 and 262 are controlled by the averaging clock signal 156 such that during the averaging time period $T_{AVG}$, switches 261, 262 couple the second feedback capacitor 260 between the common node 212 and the output node 213. During a non-overlapping portion of the clock cycle (with respect to the averaging time period) the second differential feedback capacitor 260 is coupled to reference node 288, this may be referred to as a reset time for the second differential feedback capacitor 260. This is achieved by closing the fifth differential reference and sixth differential reference switches 263 and 264 during either or both of the first and second clock time periods $T_1$ and $T_2$. Thus during the time period $T_{AVG}$, the feedback network of the amplifier 203 includes the parallel combination of capacitors 204 and 260 between output 203d and input 203b and further includes the parallel combination of capacitors 104 and 160 between the output 203c and the input 203a of the amplifier.

In yet another embodiment a fourth time period $T_{RESET}$ which does not overlap with the averaging time period, but may at least partially overlap with the first and second time periods may also be used to reset the switched feedback capacitors 160 and 260.

The DC gain and cutoff frequency of the differential circuit may be calculated as described above in relation to the single-ended case. As described for the single-ended case above, with the second differential feedback capacitor 260 coupled between nodes 212 and 213 and reference node 289 coupled to a reference potential rather than to the output 213, a low pass filter (LPF) characteristic is provided.

It will be appreciated by those of ordinary skill in the art that while the differential notch filter embodiment is shown to have two switched capacitor sampling networks coupled to each input terminal 111, 211, other numbers of switched capacitor sampling networks may be used. Furthermore, the differential notch filter 200 may implement "accumulate and dump" or running average sampling schemes as discussed above.

As is known, there are a variety of types of magnetic field sensing elements, including, but not limited to, Hall Effect elements, including, for example, a planar Hall element, and a vertical Hall element. Hall Effect elements generate an output voltage proportional to a magnetic field.

Magnetic field sensors, i.e., circuits that use magnetic field sensing elements, are used in a variety of applications, including, but not limited to, a current sensor that senses a magnetic field generated by a current carried by a current-carrying conductor, a linear magnetic sensor that generates an analog or digital output in proportion to the strength of a magnetic field, a magnetic switch that senses the proximity of a ferromagnetic object, a rotation detector that senses passing ferromagnetic articles, for example magnetic domains of a ring magnet, and a magnetic field sensor that senses a magnetic field density of a magnetic field.

Many transducers including Hall Effect elements tend to be limited in accuracy by a variety of factors, including, but not limited to, the DC offset of the output signal from the Hall Effect element. Having a DC offset, the Hall Effect element or other magnetic field such as a magnetoresistance element generates an output signal representative of a non-zero magnetic field when in the presence of a zero magnetic field. Particularly for small sensed magnetic fields, the offset can result in a substantial error.

A variety of techniques are used to reduce a DC offset associated with a magnetic field sensing element, for example, techniques described in U.S. Pat. No. 5,621,319 entitled "Chopped Hall Sensor with Synchronously Chopped Sample and Hold Circuit," which issued on Apr. 15, 1997; techniques described in U.S. Pat. No. 7,425,821 entitled "Chopped Hall Effect Sensor," which issued on Sep. 16, 2008; techniques described in U.S. patent application Ser. No. 12/111,554 entitled "Chopper-Stabilized Amplifier and Magnetic Field Sensor," which was filed on Apr. 29, 2008, each of which is assigned to the assignee of the present invention, and each of which is incorporated by reference herein in its entirety.

In order to improve the performance of a chopped Hall Effect sensor, a sine, notch filter may be useful for example as is described in U.S. Pat. No. 7,425,821. The notch filter of the present invention is particularly desirable since it may have a reduced size when compared to previous such filters. The size reduction is due to the simultaneous averaging and transferring of the capacitor charge (thereby eliminating the need for a buffering stage) and also possibly due to the elimination of a smoothing filter in applications in which the low pass filtering provided by the described notch filter suffices.

Figure 3:
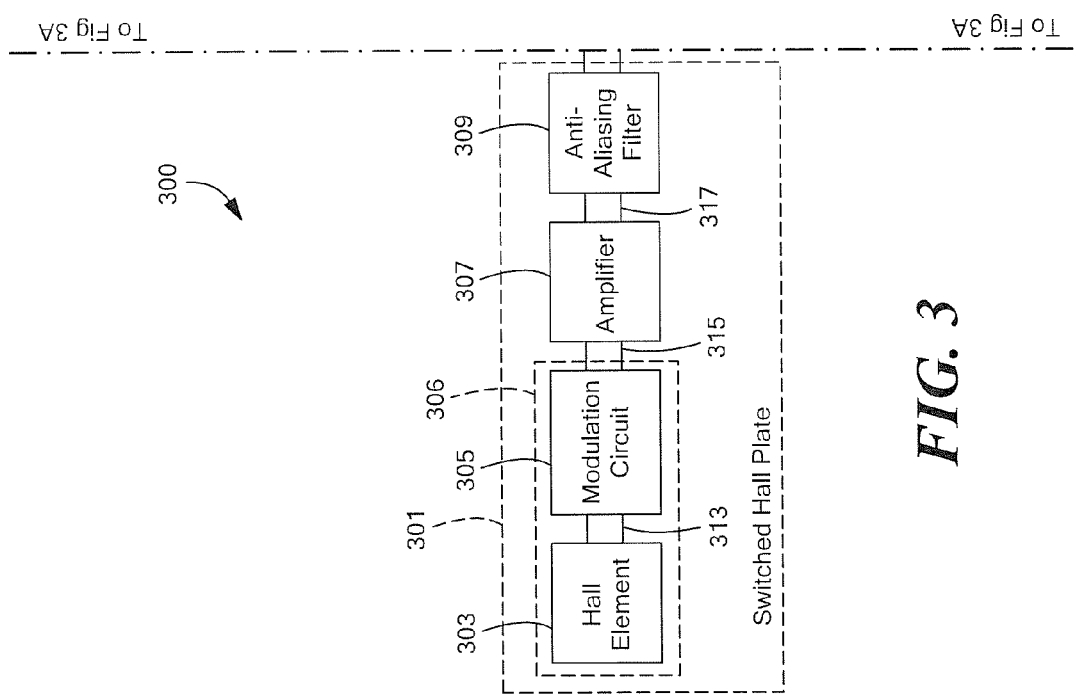
FIGS. 3 and 3A is a schematic of a magnetic sensor which utilizes a switched capacitor notch filter according to a further aspect of the invention.
Figure 3A:
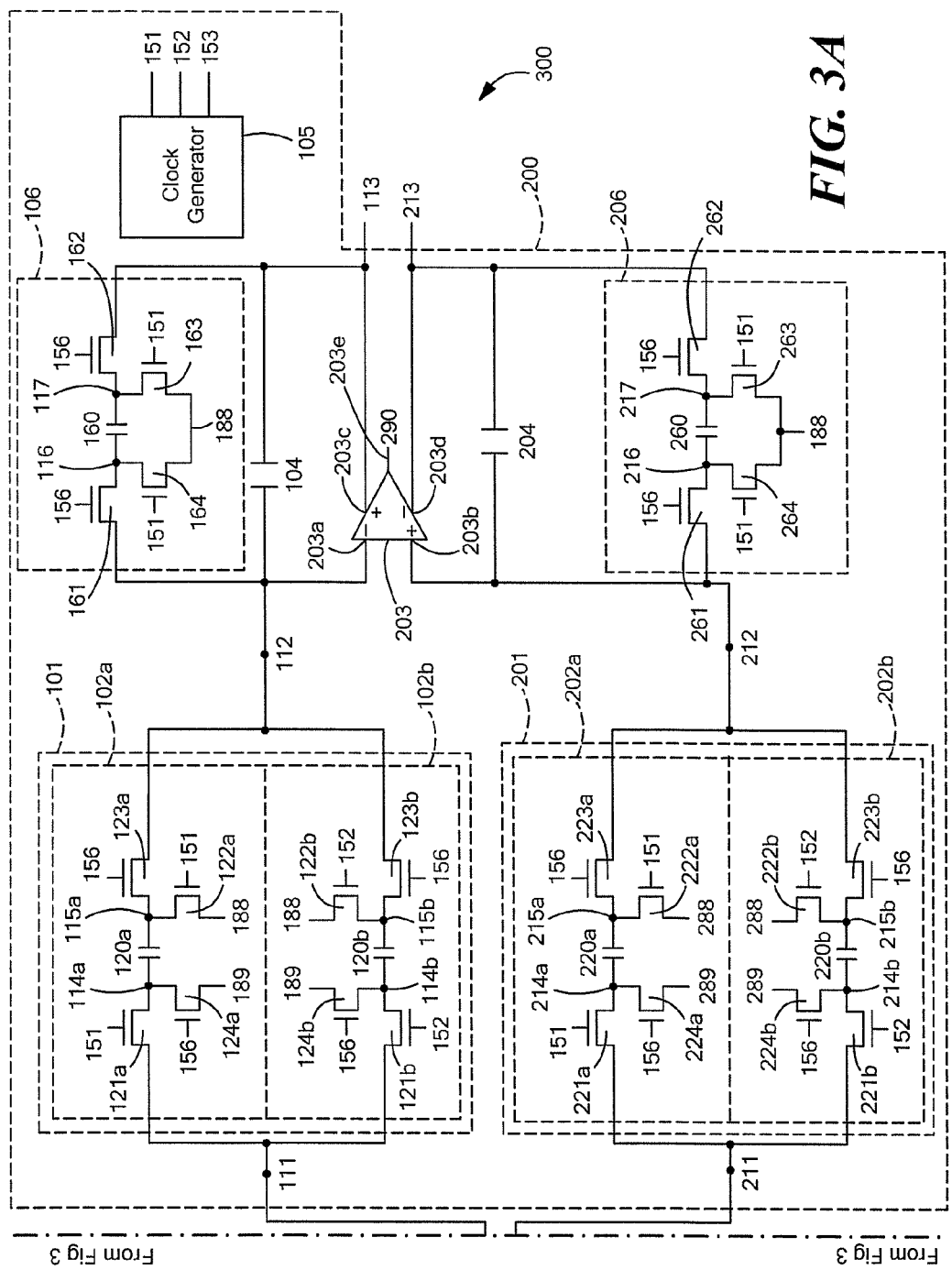

Referring now to FIGS. 3 and 3A a chopped Hall Effect sensor 300 includes differential notch filter 200 (FIG. 2) and a Hall plate circuit 301. The transducer 303 here shown as a Hall element may include but is not limited to a planar Hall element, or a vertical Hall element. Alternatively the Hall element may be replaced by a magnetoresistive element (e.g., including but not limited to, an anisotropic magnetoresistance (AMR) element, a giant magnetoresistance (GMR) element, a tunneling magnetoresistance element (TMR)), or general transducer (for example an accelerometer, flow sensor, or pressure sensor). The Hall element 303 has an output 313 that varies in accordance with a sensed magnetic field and a Hall modulation circuit 305 is responsive to the output 313 and provides a modulation circuit output signal at an output 315. The Hall element 303 and the Hall modulation circuit 305 combine to form a switched Hall plate 306. The modulation circuit output signal 315 is coupled to the input of amplifier stage 307. In some embodiments an anti-aliasing filter 309 may be coupled between the amplifier output 317 and inputs 111 and 211 to the differential notch filter 200. The anti-aliasing filter 309 removes frequency components above the modulation frequency to ensure that the notch filter meets the Nyquist criterion for noise signals. The notch or operating frequency of the notch filter 200 is selected to remove the modulated offset signal component (ripple) and thus is tuned to the modulation frequency at which the offset signal component is modulated when it reaches the notch filter.

In another embodiment a four phase chopper Hall Effect circuit may be implemented. In this case there would be four switched capacitor sampling networks in each sampling network 101 and 201 as described in connection with FIG. 1B above.

All references cited herein are hereby incorporated herein by reference in their entirety.

Having described preferred embodiments of the invention, it will now become apparent to one of ordinary skill in the art that other embodiments incorporating their concepts may be used. It is felt therefore that these embodiments should not be limited to disclosed embodiments, but rather should be limited only by the spirit and scope of the appended claims.

What is claimed is:

1. A switched capacitor notch filter to remove unwanted components within a predetermined frequency range of an input signal, comprising:
a first sampling capacitor having a first terminal selectively coupled to the input signal by a first switch and having a second terminal selectively coupled to a common node by a second switch;
a second sampling capacitor having a first terminal selectively coupled to the input signal by a third switch and having a second terminal selectively coupled to the common node by a fourth switch;
a first reference switch coupled between the second terminal of said first sampling capacitor and a first reference node;
a second reference switch coupled between the first terminal of the first sampling capacitor and a second reference node;
a third reference switch coupled between the second terminal of said second sampling capacitor and said first reference node;
a fourth reference switch coupled between the first terminal of the second sampling capacitor and said second reference node;
an operational amplifier having a first input node coupled to the common node, a second input node, and an output node at which a filtered signal of the filter is provided;
a first feedback capacitor coupled between the output node and the first input node of the operational amplifier; and
a clock signal generator for providing a first clock signal to close the first switch and the first reference switch during a first portion of each clock cycle, a second, non-overlapping clock signal to close the third switch and the third reference switch during a second non-overlapping portion of each clock cycle and an averaging, non-overlapping clock signal to close the second switch, fourth switch, second reference switch, and fourth reference switch during a third non-overlapping portion of each clock cycle, wherein the input signal is not sampled during the third portion of each clock cycle.

2. The filter of claim 1 further comprising a second feedback capacitor that is selectively coupled to said first input node of said operational amplifier by a fifth switch, selectively coupled to said output node of said operational amplifier by a sixth switch, and selectively coupled to said first reference node by a fifth reference switch and a sixth reference switch.

3. The filter of claim 2 wherein the fifth reference switch and sixth reference switch are closed during a selected one of said first portion of said clock cycle or said second portion of said clock cycle.

4. The filter of claim 1 wherein a first reference voltage is provided at the first reference node and a second, different reference voltage is provided at the second reference node.

5. The filter of claim 4 wherein the second reference node is connected to said output node of the operational amplifier.

6. The filter of claim 1 wherein the same reference voltage is connected to the first reference node and the second reference node.

7. The filter of claim 1 wherein said input signal is from a magnetic field sensor.

8. The filter of claim 7 wherein said magnetic field sensor comprises a Hall Effect transducer.

9. The filter of claim 2 wherein the fifth switch and the sixth switch are closed during the averaging portion of each clock cycle.

10. The filter of claim 1 wherein the second reference node is connected to said output node of the operational amplifier.

11. A switched capacitor notch filter to remove unwanted components within a predetermined frequency range of a differential input signal, comprising:
a first sampling capacitor having a first terminal selectively coupled to a first differential input signal by a first switch and having a second terminal selectively coupled to a common node by a second switch;
a second sampling capacitor having a first terminal selectively coupled to the first differential input signal by a third switch and having a second terminal selectively coupled to the common node by a fourth switch;
a first reference switch coupled between the second terminal of said first sampling capacitor and a first reference node;
a second reference switch coupled between the first terminal of the first sampling capacitor and a second reference node;
a third reference switch coupled between the second terminal of said second sampling capacitor and said first reference node;
a fourth reference switch coupled between the first terminal of the second sampling capacitor and said second reference node;
a first differential sampling capacitor having a first terminal selectively coupled to a second differential input signal by a first differential switch and having a second terminal selectively coupled to a differential common node by a second differential switch;
a second differential sampling capacitor having a first terminal selectively coupled to the second differential input signal by a third differential switch and having a second terminal selectively coupled to the differential common node by a fourth differential switch;
a first differential reference switch coupled between the second terminal of said first differential sampling capacitor and a first differential reference node;
a second differential reference switch coupled between the first terminal of the first differential sampling capacitor and a second differential reference node;
a third differential reference switch coupled between the second terminal of said second differential sampling capacitor and said first differential reference node;
a fourth differential reference switch coupled between the first terminal of the second differential sampling capacitor and said second differential reference node;
an operational amplifier having a first input node coupled to the common node, a second input node coupled to said differential common node, a first output node and a second output node across which a filtered signal of the filter is provided;
a first feedback capacitor coupled between the first output node and the first input node of the operational amplifier; and
a first differential feedback capacitor coupled between said second input node and the second output node of said operational amplifier; and
a clock signal generator for providing a first clock signal to close the first, first reference, first differential, and first differential reference switches during a first portion of each clock cycle and a second, non-overlapping clock signal to close the third, third reference, third differential and third differential reference switches during a second non-overlapping portion of each clock cycle, and an averaging, non-overlapping clock signal to close the second, second reference, second differential, second differential reference, fourth, fourth reference, fourth differential, and fourth differential reference switches during an averaging non-overlapping portion of each clock cycle wherein the differential input signal is not sampled during the averaging portion of each clock cycle.

12. The filter of claim 11 wherein a first reference voltage is provided at the first reference node, a second different reference voltage is provided at the second reference node, a third different reference voltage is provided at the first differential reference node, and a fourth different reference voltage is provided at the second differential reference node.

13. The filter of claim 11 wherein the second reference node is connected to the first output node of the operational amplifier and the fourth reference node is connected to the second output node of the operational amplifier.

14. The filter of claim 11 wherein said first and second input signals are from a magnetic field sensor input.

15. The filter of claim 14 wherein said magnetic field sensor comprises a Hall Effect transducer.

16. The filter of claim 11 wherein the same reference voltage is connected to the first reference node, second reference node, first differential reference node, and second differential reference node.

17. The filter of claim 11 further comprising:
   a second feedback capacitor that is selectively coupled to said first input node of said operational amplifier by a fifth switch, selectively coupled to said first output node of said operational amplifier by a sixth switch , and selectively coupled to said first reference node by a fifth reference switch and a sixth reference switch; and
   a second differential feedback capacitor selectively coupled to the second input node of said operational amplifier by a fifth differential switch and selectively coupled to said second output node of the operational amplifier by a sixth differential switch, and selectively coupled to said first differential reference node by a fifth differential reference switch and a sixth differential reference switch.

18. The filter of claim 17 wherein the fifth switch, fifth differential switch, the sixth switch and the sixth differential switch are closed during the averaging portion of each clock cycle.

19. The filter of claim 17 wherein the fifth reference switch, fifth differential reference switch, the sixth reference switch and the sixth differential reference switch are closed during a selected one of said first portion of said clock cycle or said second portion of said clock cycle.

20. A method of filtering an input signal to remove unwanted components within a predetermined frequency range of the input signal comprising:
   sampling the input signal from an input signal terminal to charge a first capacitor during a first time period of a first clock signal and to charge a second capacitor during a second time period of a second clock signal, wherein the first time period and the second time period are non-overlapping sampling time periods; and
   coupling said first and second capacitors to an input node of an amplifying circuit comprising an operational amplifier having a feedback capacitor and an output node at which a filtered output signal is provided with switches during a third time period of a third clock signal, wherein the third time period is an averaging time period that does not overlap with any of the plurality of sampling time periods.

21. The method of filtering the input signal of claim 20 further comprising:
   coupling a second feedback capacitor in parallel with said feedback capacitor with switches during said averaging time period.

22. A method of filtering a differential input signal to remove unwanted components within a predetermined frequency range of the differential input signal comprising:
   sampling a first differential input signal from an input signal terminal to charge a first capacitor during a first time period of a first clock signal and to charge a second capacitor during a second time period of a second clock signal, wherein the first time period and the second time period are non-overlapping sampling time periods;
   sampling a second differential input signal from a second input signal terminal to charge a first differential capacitor during the first time period of the first clock signal and to charge a second differential capacitor during the second time period of the second clock signal;
   coupling said first and second capacitors to a first input node of an amplifying circuit with switches during an averaging non-overlapping time period, wherein the amplifying circuit comprises an operational amplifier having the first input node, a second input node, a first output node and a second output node across which a differential filtered output signal is provided, a feedback capacitor coupled between the first output node and the first input node and a differential feedback capacitor coupled between the second output node and the second input node; and
   coupling first and second differential capacitors to the second input node of the operational amplifier with switches during the averaging non-overlapping time period, wherein the averaging time period does not overlap with any of the plurality of sampling time periods.

23. The method of filtering the differential input signal of claim 22 further comprising:
   coupling a second feedback capacitor between said first output node and said first input node of the amplifying circuit with switches during said averaging non-overlapping time period; and
   coupling a second differential feedback capacitor between said second output node and said second input node of the amplifying circuit with differential switches during said averaging non-overlapping time period.

24. A switched capacitor notch filter, comprising:
   a first sampling capacitor having a first terminal selectively coupled to an input signal by a first switch and having a second terminal selectively coupled to a common node by a second switch;
   a second sampling capacitor having a first terminal selectively coupled to the input signal by a third switch and having a second terminal selectively coupled to the common node by a fourth switch;
   a third sampling capacitor having a first terminal selectively coupled to the input signal by a seventh switch and having a second terminal selectively coupled to the common node by an eighth switch;
   a fourth sampling capacitor having a first terminal selectively coupled to the input signal by a ninth switch and having a second terminal selectively coupled to the common node by a tenth switch;
   a first reference switch coupled between the second terminal of said first sampling capacitor and a first reference node;
   a second reference switch coupled between the first terminal of the first sampling capacitor and a second reference node;
   a third reference switch coupled between the second terminal of said second sampling capacitor and said first reference node;
   a fourth reference switch coupled between the first terminal of the second sampling capacitor and said second reference node;
   a seventh reference switch coupled between the second terminal of the third sampling capacitor and said first reference node;

an eighth reference switch coupled between the first terminal of the third sampling capacitor and said second reference node;
a ninth reference switch coupled between the second terminal of said fourth sampling capacitor and said first reference node;
a tenth reference switch coupled between the first terminal of the fourth sampling capacitor and said second reference node;
an operational amplifier having a first input node coupled to the common node, a second input node, and an output node at which an output signal of the filter is provided;
a first feedback capacitor coupled between the output node and the first input node of the operational amplifier; and
a clock signal generator for providing a first clock signal to close the first switch and the first reference switch during a first portion of each clock cycle, a second, non-overlapping clock signal to close the third switch and the third reference switch during a second non-overlapping portion of each clock cycle, a third, non-overlapping clock signal to close the seventh switch and the seventh reference switch during a third non-overlapping portion of each clock cycle, a fourth, non-overlapping clock signal to close the ninth switch and the ninth reference switch during a fourth non-overlapping portion of each clock signal, and an averaging, non-overlapping clock signal to close the second switch, fourth switch, eighth switch, tenth switch, $_{seco}$nd reference switch, fourth reference switch, eighth reference switch, and tenth reference switch during a fifth non-overlapping portion of each clock cycle.

25. The filter of claim 24 further comprising a second feedback capacitor that is selectively coupled to said first input node of said operational amplifier by a fifth switch, selectively coupled to said output node of said operational amplifier by a sixth switch, and selectively coupled to said first reference node by a fifth reference switch and a sixth reference switch.

26. A switched capacitor notch filter, comprising:
a first sampling capacitor having a first terminal selectively coupled to an input signal by a first switch and having a second terminal selectively coupled to a common node by a second switch;
a second sampling capacitor having a first terminal selectively coupled to the input signal by a third switch and having a second terminal selectively coupled to the common node by a fourth switch;
a third sampling capacitor having a first terminal selectively coupled to the input signal by a seventh switch and having a second terminal selectively coupled to the common node by an eighth switch;
a fourth sampling capacitor having a first terminal selectively coupled to the input signal by a ninth switch and having a second terminal selectively coupled to the common node by a tenth switch;
a first reference switch coupled between the second terminal of said first sampling capacitor and a first reference node;
a second reference switch coupled between the first terminal of the first sampling capacitor and a second reference node;
a third reference switch coupled between the second terminal of said second sampling capacitor and said first reference node;
a fourth reference switch coupled between the first terminal of the second sampling capacitor and said second reference node;
a seventh reference switch coupled between the second terminal of the third sampling capacitor and said first reference node;
an eighth reference switch coupled between the first terminal of the third sampling capacitor and said second reference node;
a ninth reference switch coupled between the second terminal of said fourth sampling capacitor and said first reference node;
a tenth reference switch coupled between the first terminal of the fourth sampling capacitor and said second reference node;
a first differential sampling capacitor having a first terminal selectively coupled to a second input signal by a first differential switch and having a second terminal selectively coupled to a differential common node by a second differential switch;
a second differential sampling capacitor having a first terminal selectively coupled to the second input signal by a third differential switch and having a second terminal selectively coupled to the differential common node by a fourth differential switch;
a third differential sampling capacitor having a first terminal selectively coupled to the second input signal by a seventh differential switch and having a second terminal selectively coupled to the differential common node by an eighth differential switch;
a fourth differential sampling capacitor having a first terminal selectively coupled to the second input signal by a ninth differential switch and having a second terminal selectively coupled to the differential common node by a tenth differential switch;
a first differential reference switch coupled between the second terminal of said first differential sampling capacitor and a first differential reference node;
a second differential reference switch coupled between the first terminal of the first differential sampling capacitor and a second differential reference node;
a third differential reference switch coupled between the second terminal of said second differential sampling capacitor and said first differential reference node;
a fourth differential reference switch coupled between the first terminal of the second differential sampling capacitor and said second differential reference node;
a seventh differential reference switch coupled between the second terminal of the third differential sampling capacitor and said first differential reference node;
an eighth differential reference switch coupled between the first terminal of the third differential sampling capacitor and said second differential reference node;
a ninth differential reference switch coupled between the second terminal of said fourth differential sampling capacitor and said first differential reference node;
a tenth differential reference switch coupled between the first terminal of the fourth differential sampling capacitor and said second differential reference node;
an operational amplifier having a first input node coupled to the common node, a second input node coupled to the differential common node, a first output node and a second output node across which an output signal of the filter is provided;
a first feedback capacitor coupled between the first output node and the first input node of the operational amplifier;
a first differential feedback capacitor coupled between said second input node and the second output node of said operational amplifier; and a clock signal generator for providing a first clock signal to close the first switch, the first differential switch, the first reference switch, and the first differential reference switch during a first portion of each clock cycle, a second, non-overlapping clock signal to close the third switch, third differential switch, the third reference switch, and the third differential reference switch during a second non-overlapping portion of each clock cycle, a third, non-overlapping clock signal to close the seventh switch, seventh differential switch, the seventh reference switch, and the seventh differential reference switch during a third non-overlapping portion of each clock cycle, a fourth, non-overlapping clock signal to close the ninth switch, the ninth differential switch, the ninth reference switch, and the ninth differential reference switch during a fourth non- overlapping portion of each clock cycle, and an averaging, non-overlapping clock signal to close the second switch, fourth switch, eighth switch, tenth switch, second differential switch, fourth differential switch, eighth differential switch, tenth differential switch, second reference switch, fourth reference switch, eighth reference switch, tenth reference switch, second differential reference switch, fourth differential reference switch, eighth differential reference switch, and tenth differential reference switch during a fifth non-overlapping portion of each clock cycle.

27. A switched capacitor notch filter, comprising:
a first sampling capacitor having a first terminal selectively coupled to an input signal by a first switch and having a second terminal selectively coupled to a common node by a second switch;
a second sampling capacitor having a first terminal selectively coupled to the input signal by a third switch and having a second terminal selectively coupled to the common node by a fourth switch;
a third sampling capacitor having a first terminal selectively coupled to the input signal by a seventh switch and having a second terminal selectively coupled to the common node by an eighth switch;
a fourth sampling capacitor having a first terminal selectively coupled to the input signal by a ninth switch and having a second terminal selectively coupled to the common node by a tenth switch;
a first reference switch coupled between the second terminal of said first sampling capacitor and a first reference node;
a second reference switch coupled between the first terminal of the first sampling capacitor and a second reference node;
a third reference switch coupled between the second terminal of said second sampling capacitor and said first reference node;
a fourth reference switch coupled between the first terminal of the second sampling capacitor and said second reference node;
a seventh reference switch coupled between the second terminal of the third sampling capacitor and said first reference node;
an eighth reference switch coupled between the first terminal of the third sampling capacitor and said second reference node;
a ninth reference switch coupled between the second terminal of said fourth sampling capacitor and said first reference node;
a tenth reference switch coupled between the first terminal of the fourth sampling capacitor and said second reference node;

an operational amplifier having a first input node coupled to the common node, a second input node, and an output node at which an output signal of the filter is provided;
a first feedback capacitor coupled between the output node and the first input node of the operational amplifier; and
a clock signal generator for providing a first clock signal to close the first switch, the first reference switch, the seventh switch, and the seventh reference switch during a first portion of each clock cycle, a second, non-overlapping clock signal to close the third switch, the third reference switch, ninth switch, and the ninth reference switch during a second non-overlapping portion of each clock cycle, a first averaging, non-overlapping clock signal to close the second switch, fourth switch, second reference switch, and fourth reference switch during a third non- overlapping portion of each clock cycle, and a second averaging, non-overlapping clock signal to close the eighth switch, tenth switch, eighth reference switch, and tenth reference switch during a fourth non-overlapping portion of each clock cycle.

28. The filter of claim 27 further comprising a second feedback capacitor that is selectively coupled to said first input node of said operational amplifier by a fifth switch, selectively coupled to said first output node of said operational amplifier by a sixth switch, and selectively coupled to said first reference node by a fifth reference switch and a sixth reference switch.

29. A switched capacitor notch filter, comprising:
a first sampling capacitor having a first terminal selectively coupled to an input signal by a first switch and having a second terminal selectively coupled to a common node by a second switch;
a second sampling capacitor having a first terminal selectively coupled to the input signal by a third switch and having a second terminal selectively coupled to the common node by a fourth switch;
a third sampling capacitor having a first terminal selectively coupled to the input signal by a seventh switch and having a second terminal selectively coupled to the common node by an eighth switch;
a fourth sampling capacitor having a first terminal selectively coupled to the input signal by a ninth switch and having a second terminal selectively coupled to the common node by a tenth switch;
a first reference switch coupled between the second terminal of said first sampling capacitor and a first reference node;
a second reference switch coupled between the first terminal of the first sampling capacitor and a second reference node;
a third reference switch coupled between the second terminal of said second sampling capacitor and said first reference node;
a fourth reference switch coupled between the first terminal of the second sampling capacitor and said second reference node;
a seventh reference switch coupled between the second terminal of the third sampling capacitor and said first reference node;
an eighth reference switch coupled between the first terminal of the third sampling capacitor and said second reference node;
a ninth reference switch coupled between the second terminal of said fourth sampling capacitor and said first reference node;

a tenth reference switch coupled between the first terminal of the fourth sampling capacitor and said second reference node;

a first differential sampling capacitor having a first terminal selectively coupled to a second input signal by a first differential switch and having a second terminal selectively coupled to a differential common node by a second differential switch;

a second differential sampling capacitor having a first terminal selectively coupled to the second input signal by a third differential switch and having a second terminal selectively coupled to the differential common node by a fourth differential switch;

a third differential sampling capacitor having a first terminal selectively coupled to the second input signal by a seventh differential switch and having a second terminal selectively coupled to the differential common node by an eighth differential switch;

a fourth differential sampling capacitor having a first terminal selectively coupled to the second input signal by a ninth differential switch and having a second terminal selectively coupled to the differential common node by a tenth differential switch;

a first differential reference switch coupled between the second terminal of said first differential sampling capacitor and a first differential reference node;

a second differential reference switch coupled between the first terminal of the first differential sampling capacitor and a second differential reference node;

a third differential reference switch coupled between the second terminal of said second differential sampling capacitor and said first differential reference node;

a fourth differential reference switch coupled between the first terminal of the second differential sampling capacitor and said second differential reference node;

a seventh differential reference switch coupled between the second terminal of the third differential sampling capacitor and said first differential reference node;

an eighth differential reference switch coupled between the first terminal of the third differential sampling capacitor and said second differential reference node;

a ninth differential reference switch coupled between the second terminal of said fourth differential sampling capacitor and said first differential reference node;

a tenth differential reference switch coupled between the first terminal of the fourth differential sampling capacitor and said second differential reference node;

an operational amplifier having a first input node coupled to the common node, a second input node coupled to the differential common node, a first output node and a second output node across which an output signal of the filter is provided;

a first feedback capacitor coupled between the first output node and the first input node of the operational amplifier;

a first differential feedback capacitor coupled between said second input node and the second output node of said operational amplifier; and a clock signal generator for providing a first clock signal to close the first switch, the first reference switch, the first differential switch, the first differential reference switch, the seventh switch, the seventh reference switch, the seventh differential switch, and the seventh differential reference switch during a first portion of each clock cycle, a second, non-overlapping clock signal to close the third switch, the third reference switch, the third differential switch, the third differential reference switch, the ninth switch, the ninth reference switch, the ninth differential switch and the ninth differential reference switch during a second non-overlapping portion of each clock cycle, a first averaging, non-overlapping clock signal to close the second switch, second differential switch, fourth switch, eighth differential switch, second reference switch second differential reference switch, fourth reference switch, and the eighth differential reference switch during a third non-overlapping portion of each clock cycle, and a second averaging, non-overlapping clock signal to close the fourth switch, eighth differential switch, tenth switch, tenth differential switch, eighth reference switch, fourth differential reference switch, tenth reference switch, and tenth differential reference switch during a fourth non-overlapping portion of each clock cycle.

30. The filter of claim 29 further comprising:

a second feedback capacitor that is selectively coupled to said first input node of said operational amplifier by a fifth switch, selectively coupled to said first output node of said operational amplifier by a sixth switch, and selectively coupled to said first reference node by a fifth reference switch and a sixth reference switch; and a second differential feedback capacitor selectively coupled to the second input node of said operational amplifier by a fifth differential switch and selectively coupled to said second output node of the operational amplifier by a sixth differential switch, and selectively coupled to said third reference node by a fifth differential reference switch and a sixth differential reference switch.

* * * * *

UNITED STATES PATENT AND TRADEMARK OFFICE
CERTIFICATE OF CORRECTION

PATENT NO. : 7,990,209 B2  
APPLICATION NO. : 12/487965  
DATED : August 2, 2011  
INVENTOR(S) : Hernan D. Romero Page 1 of 1

It is certified that error appears in the above-identified patent and that said Letters Patent is hereby corrected as shown below:

Column 2, line 67 delete "coupled the" and replace with --coupled to the--.

Column 7, line 3 delete "$T_{ANG}$" and replace with --$T_{AVG}$--.

Column 9, line 49 delete "node" and replace with --nodes--.

Column 17, line 28 delete "$_{seco}$nd" and replace with --second--.

Column 22, line 24 delete "switch second" and replace with --switch, second--.

Signed and Sealed this  
Eighth Day of November, 2011

David J. Kappos  
*Director of the United States Patent and Trademark Office*